US005571657A

United States Patent [19]

Szmanda et al.

[11] Patent Number: 5,571,657
[45] Date of Patent: Nov. 5, 1996

[54] MODIFIED CATION EXHANGE PROCESS

[75] Inventors: Charles R. Szmanda, Westborough; Richard J. Carey, Sherborn, both of Mass.

[73] Assignee: Shipley Company, Inc., Marlborough, Mass.

[21] Appl. No.: 128,994

[22] Filed: Sep. 30, 1993

[51] Int. Cl.$^6$ .................................................. G03C 1/73
[52] U.S. Cl. ........................ 430/270.1; 528/480; 210/681; 210/688
[58] Field of Search ........................... 430/270; 528/480; 210/681, 688

[56] References Cited

U.S. PATENT DOCUMENTS

| | | | |
|---|---|---|---|
| 2,628,165 | 3/1950 | Bliss | 423/105 |
| 4,002,564 | 1/1977 | Carbonel et al. | 210/38 |
| 5,021,216 | 6/1991 | Whitney et al. | 210/669 |
| 5,234,789 | 8/1993 | Favier, Jr. et al. | 430/272 |
| 5,300,628 | 4/1994 | Honda | 528/482 |
| 5,378,802 | 1/1995 | Honda | 528/480 |
| 5,446,125 | 8/1995 | Honda et al. | 430/190 |

FOREIGN PATENT DOCUMENTS

| | | |
|---|---|---|
| 544325 | 11/1992 | European Pat. Off. . |
| 544324 | 11/1992 | European Pat. Off. . |
| 4065415 | 3/1992 | Japan . |
| 5-234876 | 9/1993 | Japan . |

OTHER PUBLICATIONS

Honda, Kenji. "Removal of metal impurity from resist materials", JP 5–234876A2, Sep. 10, 1993.

*Primary Examiner*—George F. Lesmes
*Assistant Examiner*—Laura Weiner
*Attorney, Agent, or Firm*—Robert L. Goldberg

[57] ABSTRACT

The invention is a process of removing metal ion contaminants from an organic solution, especially one having acid labile components. The process comprises modifying a cationic exchange resin by treatment with ammonia or amine and contacting said modified ion exchange resin with an organic solution containing metal ion contaminants. The process is especially useful for treating photoresist compositions.

4 Claims, No Drawings

MODIFIED CATION EXHANGE PROCESS

BACKGROUND OF THE INVENTION

1. Introduction

This invention relates to removal of metal ions from organic solvents. The invention is especially useful for the removal of metal ions from organic solvents and solutions of photoresist components.

2. Description of the Prior Art

It is known in the art that organic solvents are often contaminated with metal ions. This contamination is typically due to raw materials used to manufacture the solvent, the reactants, and the reaction vessels in which the solvents are prepared.

The level of metal ion contamination in a solvent may range up to about 500 parts per million parts of solvent (ppm) or more dependent upon the solvent and the manner in which the solvent is prepared. For many commercial applications, this level of metal ion contamination is acceptable. However, for other commercial applications, such as use of organic solvents in the manufacture of pharmaceuticals, radio pharmaceuticals, processing chemicals such as functionalized silanes for optical fibers, adhesion promoters, acid sensitive hydraulic fluids, dielectric fluids, reference standards and in the manufacture of chemicals for microlithography, this level of contamination is unacceptable. Using microlithography and the manufacture of integrated circuits for purposes of illustration, sodium and potassium ions are particularly problematic. According to Elliot, *Integrated Circuit Fabrication Technology*, McGraw-Hill Book Company, New York, pp. 312–313, 1982, most positive photoresists have a total metal content of less than 1 ppm. Moreover, it is the current goal of photoresist manufacturers to reduce the metal ion content of such photoresists to levels not exceeding 100 parts per billion (ppb) and preferably, not exceeding 10 ppb.

It is known in the art to remove metal ion contaminants from photoresist components using highly acidic cation exchange materials. The removal of such contaminants using cation exchange materials is disclosed in U.S. Pat. No. 5,234,789 and Japanese applications Nos. 5148309, 91339728, 5148306 and 4065415, each incorporated herein by reference for their teaching of the use of cation exchange resins for purifying photoresist components and for the disclosure of suitable cation exchange materials for that purpose.

Ethyl lactate is a known and commonly used solvent for photoresists. It is known from U.S. Pat. No. 5,234,789 that the use of cation exchange resins to purify ethyl lactate solvents at elevated temperatures results in transesterification and saponification reactions with the formation of a lactide and other by-products. In accordance with said patent, the presence of a polylactide in a photoresist composition is advantageous as the lactide is said to function as a lithographic speed enhancer. However, it has now been discovered that the advantage of speed enhancement is outweighed by disadvantages resulting from the presence of by-products such as degradation of the thermal properties of a photoresist coating containing the lactide and difficulty in controlling the photospeed of the photoresist during manufacture.

In addition to the formation of lactides in ethyl lactate, it is also known that undesirable by products are formed when most acid labile materials are treated with a cation exchange resin. Therefore, it is desirable to find a method by which metal ion contaminants can be removed from acid labile materials without the formation of undesirable by-products.

SUMMARY OF THE INVENTION

In accordance with the invention, modified ion exchange resins are used to remove metal ion contaminants from organic solutions containing acid labile components without formation of undesired by-products. The invention is in part based upon the unexpected discovery that the reactions of acid labile materials with cation exchange groups are inhibited or prevented when the cation exchange resin used has acid protons replaced by ammonium ions prior to use, such resins hereinafter being referred to as ammoniated cation exchange resins. Accordingly, the procedure of the invention comprises removal of metal ion contaminants from organic solutions comprising acid labile materials by contact of the solution with an ammoniated cation exchange resin, preferably a cation exchange resin treated with ammonia, an amine or a quaternary ammonium hydroxide prior to contact with the organic solution.

It is a further unexpected discovery of the invention that metal ions are as efficiently removed using the modified ion exchange resins of the invention as with the cation exchange resins used in the prior art.

DESCRIPTION OF THE PREFERRED EMBODIMENTS

Though the process of the invention is suitable for removal of metal contaminants from essentially any organic solvent or solution, the invention is especially suitable for removal of metallic contaminants from photoresist solutions and the description that follows will be directed to photoresist compositions for purposes of illustration but not by way of limitation.

A photoresist is an organic coating formed from a solution of a film-forming resin and a light-sensitive component that undergoes chemical change upon exposure to patterned activating radiation to form areas of differential solubility within the coating. Typical photoresist compositions are disclosed in U.S. Pat. Nos. 5,178,986; 5,212,046; 5,216,111 and 5,238,776; each incorporated herein by reference for disclosure of photoresist compositions, processing and use.

All photoresists used for the formation of integrated circuits require a low concentration of metal ions inclusive of those photoresists disclosed in the aforesaid U.S. patents. However, many of the components of photoresists used for integrated circuit manufacture contain acid labile groups that are subject to attack by cation exchange materials. For example, typical photoresist solvents containing acid labile groups include ethyl lactate, dibasic esters such as diethyl succinate, lactones such as gamma butyrolactone, amides such as dimethyl formamide and N-methylpyrrolidone, acetals such as pyruvic aldehyde dimethyl acetal and ketals.

Typical resins used in photoresist compositions containing acid labile groups include t-butyloxycarbonate esters of phenolic resins, t-butylacetic acid of phenolic resins, epoxy novolak resins, aminoplast and melamine resins, polyesters, polyamides, polysulfonates, polyacrylate esters and polyacetals.

Typical photoactive components used in photoresist compositions containing acid labile groups include conventional photoactive compounds such as 2,1,4-diazonaphthoquinone-sulfonate esters, 2,1,5-diazonaphthoquinone-sulfonate esters and 2,1,6-diazonaphthoquinone-sulfonate esters.

Other materials used in photoresist compositions that possess acid labile groups or chromophore groups effected by strong acids include dyes such as curcumin, ethyl red, rhodamine, etc. In the case of dyes, the contact with a strong acid may alter the spectral sensitivity of the dye as well as alter its chemical composition.

In accordance with the invention, any component of the photoresist composition may be treated to remove metal contaminants by contact of the component with an ammoniated cation exchange resin. The invention is especially suitable for treating solvents used in the formulation of a photoresist composition. However, any one or more of the remaining components of the photoresist may be treated by dissolving the same in the photoresist solvent and contacting the solution so formed with the ammoniated cation exchange resin.

Any cation exchange material used to remove metallic contaminants from an organic solution in the prior art may be ammoniated in accordance with the procedures of the invention. Suitable cation exchange materials are disclosed in the aforesaid U.S. Pat. No. 5,234,789 and Japanese applications Nos. 5148309, 91339728, 5148306, and 4065415, each incorporated herein by reference for the disclosure of suitable cation exchange resins. Preferred cation exchange resins are those having sulfonate groups on a polymer backbone such as a sulfonated styrene-divinylbenzene cross linked polymer. The most preferred cation exchange resin is a sulfonated styrene polymer sold under various trade names such as Dowex 5OX8 by Dow Chemical or IRN 77 or IR 118H by Rohm and Haas Company.

The cation exchange resins are modified in accordance with the invention by treating the same with an aqueous solution of ammonia, ammonium hydroxide, an amine or a quaternary amine having the formula $R_1R_2R_3R_4N^+OH^-$ where each R may be substituted or unsubstituted $C_{1-6}$ alkyl, especially hydroxyalkyl, or aryl, especially benzyl. The cation exchange resin may be prepared by slurrying the resin with an aqueous solution of the amine for a time varying between about 2 and 30 hours, more preferably from about 4 to 10 hours. The concentration of the amine in solution may vary between about 1 and 25% by weight but preferably varies between about 1 and 5 percent by weight. Thereafter, the resin is washed with water until a pH of about 7.0 to 7.8 is reached. Finally, the treated resin is preferably dehydrated by washing the resin with an aqueous miscible organic solvent such as ethyl lactate. The procedure can be performed at room or elevated temperature.

The organic solutions are contacted with the ammoniated ion exchange resins by slurrying the same with the resin or by passing the solution through a column of the ion exchange resin. The rate of passage of the solution through the column can vary between about 2 and 20 bed volumes per hour. Ambient conditions are suitable.

Though not wishing to be bound by theory, it is believed that by-product formation is reduced or eliminated by the process of the invention by displacing the acidic proton with an essentially non acidic cation such as an ammonium ion, a protonated amine or a quaternary ammonium cation. Accordingly, an essentially non-acidic cation is available for exchange with metallic ions rather than acidic protons as in the prior art thus reducing the effect of the acidic proton on acid labile groups.

EXAMPLE 1

One hundred grams of a sulfonic acid ion exchange resin identified as Rohm and Haas IRN 77 (26 grade) is slurried with a 20% aqueous ammonium hydroxide solution with constant stirring for 4 hours. The so treated resin is then washed with 8 bed volumes of deionized water and treated with a solvent mixture of ethyl lactate, butyl acetate and xylene (90:5:5 by weight) in an amount sufficient to remove greater than 98% of all residual moisture.

EXAMPLE 2

A photoresist having the following composition was prepared:

| | |
|---|---|
| Novolak resin[1] | 18.96 grams |
| Photoactive compound[2] | 4.54 grams |
| Solvent[3] | 76.50 grams |

[1] Novolak formed from 52.5% p-cresol, 5.5% o-cresol and 42.0% m-cresol.
[2] 2,1,5-naphthoquinone diazide sulfonic acid ester.
[3] Mixture of 60% by volume ethyl lactate, 30% anisole and 10% amyl acetate.

Ion exchange resin prepared in accordance with the procedure of Example 1 was used to treat the above photoresist composition. A glass column measuring 60 cm. in length and 2.5 cm. in diameter was filled with the ion exchange resin to a depth of 45 cm. The photoresist solution was passed through the column at a flow rate of 4 bed volumes per hour.

The above process reduced the metal ion concentration from greater than 500 ppb parts of resist to less than 10 ppb parts. No ethyl lactoyl lactate or lactic acid or other by-products were detected in the resist following treatment with the ion exchange resin.

EXAMPLE 3 (COMPARATIVE EXAMPLE)

The process of Examples 1 and 2 was repeated except that the steps of preparing the ion exchange resin by washing with aqueous ammonium hydroxide solution was omitted. Following treatment, the metal ion content was essentially the same as in Examples 1 and 2, but from 1,000 to 10,000 ppb of ethyl lactoyl lactate and between 200 and 4,000 ppb of lactic acid were found in the resist.

We claim:

1. A process for removing metal ions from an organic photoresist solution having ethyl lactate as the solvent comprising one or more acid labile photoresist components without formation of by-products, said process comprising the steps of providing said organic solution, providing a cation exchange resin modified by having strong acid protons displaced with ammonium ions by contact of the cation exchange resin with ammonium hydroxide, and contacting said organic solution with said modified cation exchange resin for a time sufficient to remove essentially all of said metal ions from said solution by exchange of said metal ions with said ammonium ions.

2. The process of claim 1 where the solution is passed through a column of the cation exchange resin.

3. The process of claim 1 where the solution is slurried with the cation exchange resin.

4. The process of claim 1 where the modified cation exchange resin is dehydrated by contact with an organic solvent prior to contact with said organic photoresist solution.

* * * * *